United States Patent
Lee

(10) Patent No.: US 7,227,216 B2
(45) Date of Patent: Jun. 5, 2007

(54) MONO GATE MEMORY DEVICE AND FABRICATING METHOD THEREOF

(75) Inventor: Sang Bum Lee, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 50 days.

(21) Appl. No.: 11/027,850

(22) Filed: Dec. 29, 2004

(65) Prior Publication Data

US 2005/0142827 A1 Jun. 30, 2005

(30) Foreign Application Priority Data

Dec. 30, 2003 (KR) .................. 10-2003-0101014

(51) Int. Cl.
*H01L 29/788* (2006.01)
(52) U.S. Cl. ...................... 257/315; 438/593
(58) Field of Classification Search ............. 257/315, 257/318, 324, 334; 438/259, 263, 305, 692, 438/693
See application file for complete search history.

(56) References Cited

U.S. PATENT DOCUMENTS

| | | | |
|---|---|---|---|
| 5,338,954 A | | 8/1994 | Shimoji |
| 6,703,662 B1 | * | 3/2004 | Koishikawa ................ 257/316 |
| 6,724,661 B2 | * | 4/2004 | Lee et al. .............. 365/185.29 |
| 2002/0011623 A1 | * | 1/2002 | Furuhata ..................... 257/315 |
| 2003/0224564 A1 | | 12/2003 | Kang et al. |

* cited by examiner

*Primary Examiner*—Phuc T. Dang
(74) *Attorney, Agent, or Firm*—Andrew D. Fortney

(57) ABSTRACT

A mono-gate memory device and fabricating method thereof are provided, which may reduce or solve over-erasing problems by implementing a mono split-gate SONOS type non-volatile memory cell, and which do not affect logic circuit characteristics by enabling logic circuit fabrication after completing the ONO structure. The present memory cell includes an ONO layer on the active area of the substrate, a gate oxide layer on the active area adjacent to the ONO layer, a gate on the gate oxide layer and on a portion of the ONO layer, a drain partially covered by the ONO layer, and a source partially covered by the gate oxide layer.

20 Claims, 3 Drawing Sheets

MONO GATE MEMORY DEVICE AND FABRICATING METHOD THEREOF

This application claims the benefit of the Korean Application No. P2003-0101014 filed on Dec. 30, 2003, which is hereby incorporated by reference.

BACKGROUND OF THE INVENTION

1. Field of the Invention

The present invention relates to a memory device and fabricating method thereof, and more particularly, to a mono-gate memory device and fabricating method thereof, in which a mono split-gate is provided by forming an ONO (oxide-nitride-oxide) layer prior to a logic circuit process and forming polysilicon on the ONO layer and the like.

2. Discussion of the Related Art

Generally, semiconductor devices are categorized into a volatile memory and a non-volatile memory. RAMs such as DRAM (dynamic random access memory), SRAM (static random access memory), and the like belong to the volatile memory category, which enables data input and storage with power application thereto only, but fails to keep storing data therein since the stored data is lost in case of power removal.

In a fabricating process, the non-volatile memory devices are categorized into (i) a floating gate type and (ii) an MIS (metal insulator semiconductor) type having a multi-layer (dual or triple layer) of at least two kinds of dielectric materials.

The floating gate type memory device implements memory characteristics using a potential well, and mainly employs an ETOX (EPROM tunnel oxide) structure applicable to flash EEPROM (electrically erasable programmable read only memory).

On the other hand, the MIS type memory device performs a memory function using charge traps in a dielectric bulk, at a dielectric-to-dielectric interface, and/or at a dielectric-to-semiconductor interface, and mainly employs a MONOS/SONOS (metal or silicon/oxide-nitride-oxide [ONO]/semiconductor) structure, which is also applicable to flash EEPROM.

FIG. 1 is a cross-sectional diagram of a conventional SONOS type memory device. Referring to FIG. 1, the SONOS type memory device includes a tunnel oxide layer 101, a trap nitride layer 102, a block oxide layer 103, and a gate 104, stacked in turn on a P type silicon substrate 100 provided with a source 105 and drain 106.

The SONOS type memory device in FIG. 1 is a charge-trap type device using a mechanism in which an electric charge tunnels through oxide film 101 on silicon 100 by a voltage applied to gate 104, causing electric charges to be injected into or to be released from a trap within silicon nitride layer 102 or at its interface with oxide film 101. In this case, a thin ONO layer is used instead of polysilicon to decrease the overall thickness of the memory device, relative to the floating gate type device. Moreover, using a tunnel oxide layer below several nanometers, it is able to remarkably reduce a size of a memory cell. Hence, SONOS type memory devices enable a high degree of integration, as well as a remarkably lowered drive voltage.

However, in case of the conventional SONOS memory device, leakage current generated from a non-selected memory cell is regarded as flowing from a selected memory cell. For instance, an over-erase phenomenon appears to lead the selected memory cell to be misread as erased on programming. Hence, the SONOS cell design or configuration may affect the logic circuit characteristics of the memory device.

SUMMARY OF THE INVENTION

Accordingly, the present invention is directed to a mono-gate memory device and fabricating method thereof that substantially obviates one or more problems due to limitations and disadvantages of the related art.

An object of the present invention is to provide a mono-gate memory device and fabricating method thereof, by which the over-erasing problem is solved by implementing a mono split-gate type non-volatile memory using a SONOS cell and by which logic circuit characteristics can remain intact.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a mono gate memory device according to the present invention includes a substrate having an active area, an ONO layer on the active area of the substrate, the ONO layer comprising, in turn, a lower tunnel oxide layer, a trap nitride layer, and an upper block oxide layer, a gate oxide layer on the active area of the substrate adjacent to the ONO layer, a gate on the gate oxide layer and a portion of the ONO layer, a drain in the active area partially under the ONO layer, and a source in the active area partially under the gate oxide layer.

In another aspect of the present invention, a method of fabricating a mono gate memory device includes the steps of forming an ONO layer on an active area of a substrate, forming a gate layer on the active area of the substrate not covered with the ONO layer, forming a gate on the gate oxide layer and on a portion of the ONO layer, and forming a drain and source in the active area partially covered by the ONO layer and the gate oxide layer, respectively.

Preferably, the ONO layer forming step includes the steps of successively depositing a tunnel oxide layer, a trap nitride layer, and a block oxide layer on the active area of the substrate and patterning the tunnel oxide layer, the trap nitride layer, and the block oxide layer on a portion of the active area.

Preferably, the gate forming step includes the steps of forming a conductive layer over the substrate and patterning the conductive layer to remain on both a portion of the ONO layer and the gate oxide layer.

More preferably, the conductive layer comprises a polysilicon layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
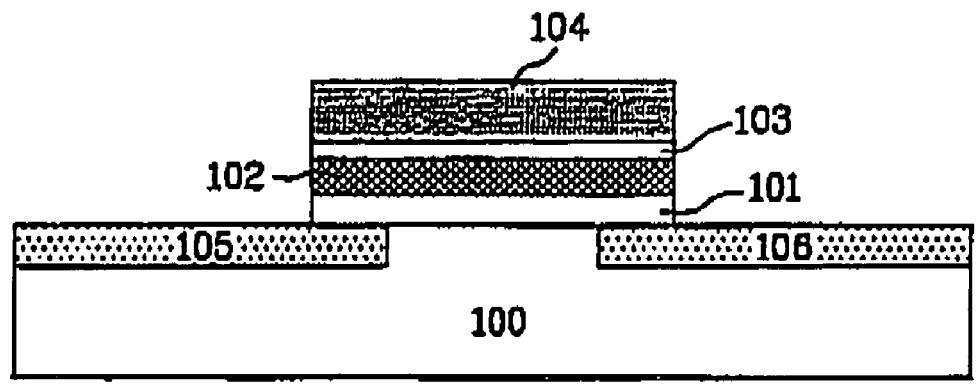
FIG. 1 is a cross-sectional diagram of a conventional SONOS type memory device.
Figure 2:
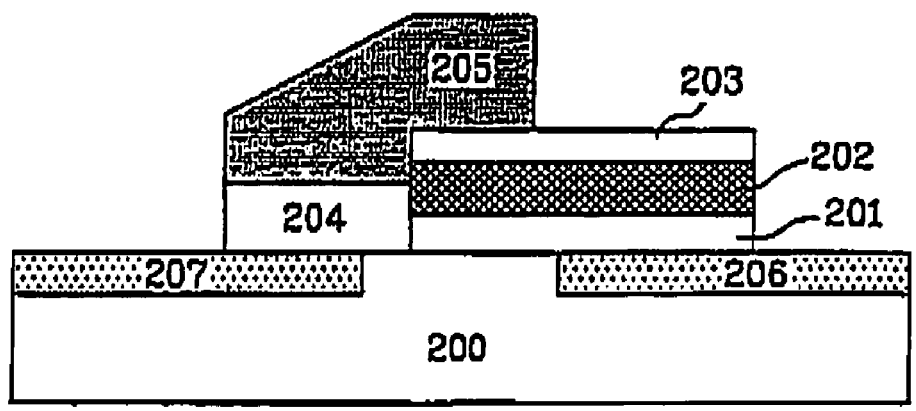
FIG. 2 is a cross-sectional diagram of a memory device according to the present invention.

FIG. 2 is a cross-sectional diagram of a memory device according to the present invention.

Referring to FIG. 2, the present mono split-gate memory device includes a tunnel oxide layer 201, trap nitride layer 202, and a block oxide layer 203 in succession (a so-called ONO layer) on an active area of a first conductive type silicon substrate 200, whereas a gate oxide layer 204 is formed on a remaining portion of the active area (i.e., excluding the portion covered by the ONO layer). Depending on the manufacturing technology or process used (e.g., 0.25 µm, 0.18 µm, 0.13 µm, etc.), tunnel oxide layer 201 may have a thickness of from 15 to 25 Å, trap nitride layer 202 may have a thickness of from 45 to 125 Å, block oxide layer 203 may have a thickness of from 20 to 50 Å, and gate oxide layer 204 may have a thickness of from 45 to 125 Å. In one embodiment, tunnel oxide layer 201 has a thickness of 20 Å, trap nitride layer 202 has a thickness of 100 Å, block oxide layer 203 has a thickness of 40 Å, and gate oxide layer 204 has a thickness of about 100 Å. A polysilicon gate 205 is on both the ONO layer and the gate oxide layer 204. Preferably, gate 205 covers the entire width of gate oxide layer 204, but gate 205 may cover either the entire width of ONO layers 201–203 or only a portion thereof. The gate 205 generally has a width about equal to the minimum design rule for a given manufacturing process or manufacturing technology, but it may be greater in some cases, as explained below. Drain/source regions 207 and 206 lie in the active area of the substrate 200, one such region in part beneath the tunnel oxide layer 201 and the other such region in part beneath the gate oxide layer 204, respectively. The edge or sidewall of ONO stack 201–203 over the transistor channel may be about halfway between source 207 and drain 206.

FIGS. 3A to 3D are cross-sectional diagrams for explaining a method of fabricating a memory device according to the present invention.

Figure 3A:
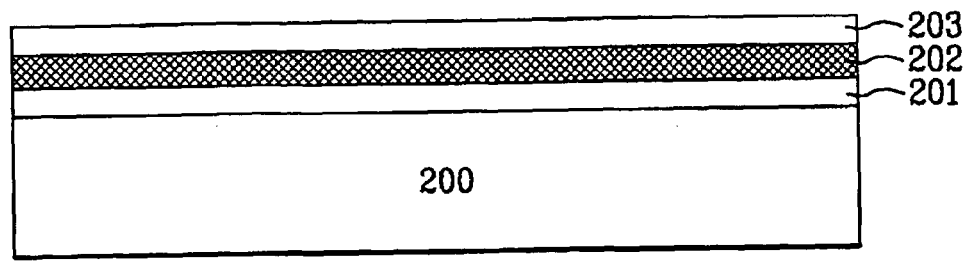
FIGS. 3A to 3D are cross-sectional diagrams for explaining a method of fabricating a memory device according to the present invention.

Referring to FIG. 3A, a tunneling oxide layer 201 is formed on a semiconductor substrate 200 (e.g., a silicon substrate), having a defined active area therein. Tunnel oxide layer 201 may be formed by any conventional process for forming an oxide film, such as chemical vapor deposition (e.g., PE-CVD or HDP-CVD), or wet or dry thermal oxidation, but thermal oxidation is preferred. A trap nitride layer 202 and a block oxide layer 203 are then (blanket) deposited by conventional deposition processes on the tunneling oxide layer 201, in turn, whereby an ONO structure is formed.

Figure 3B:
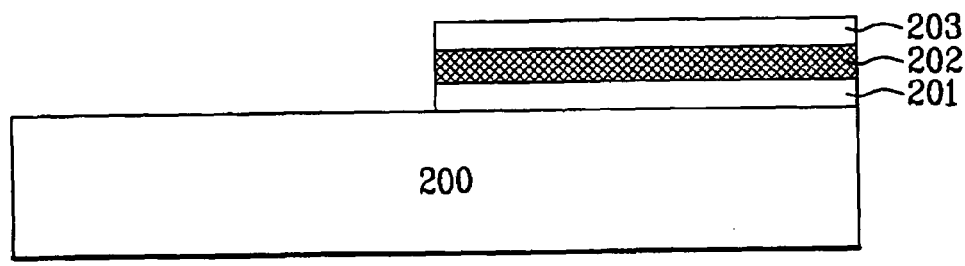

Referring to FIG. 3B, the ONO structure 203/202/201 is patterned by photolithography and etching to completely or partially define its location on the substrate 200. If completely defined, the ONO structure 203/202/201 is protected from further etching in subsequent processing steps. However, since a completely defined ONO stack 203/202/201 generally must have a width at least equal to the minimum design rule, the gate 205 in such an embodiment will have a width greater than the minimum design rule. If only one side of the ONO structure 203/202/201 is defined (e.g., the side over the channel in substrate 200), then the other side in defined in a subsequent process (e.g., gate definition by photolithography and etching). The etching process may be in steps (e.g., when different etch chemistries are desired for etching the different materials, in which case the etch may be selective for etching a particular layer relative to the underlying material) or in a single step (e.g., when using an etch chemistry that is relatively non-selective for etching oxide relative to nitride, but selective for etching oxide relative to the underlying substrate [e.g., silicon]).

Figure 3C:
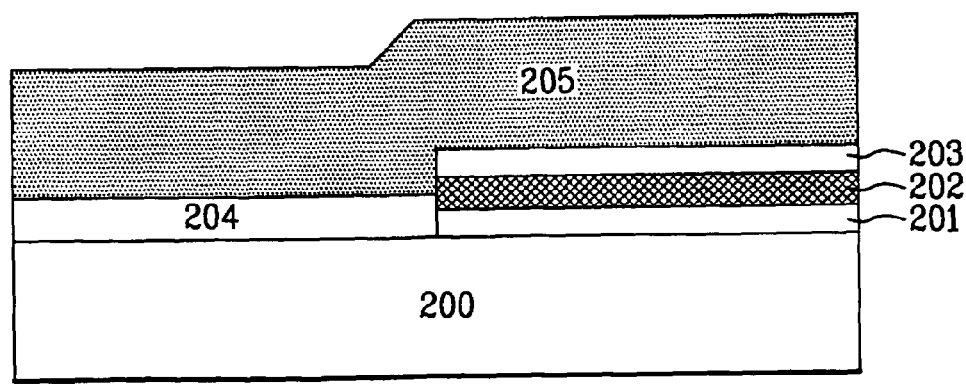

Referring to FIG. 3C, a gate oxide layer 204 is formed on a remaining portion of the active area of the substrate 200 (i.e., where the patterned ONO does not exist). Gate oxide layer 204 is preferably formed by wet or dry thermal oxidation. Then, a polysilicon layer 205 is blanket deposited over the substrate 200 including the gate oxide layer 204 and the patterned ONO structure 203/202/201.

Figure 3D:
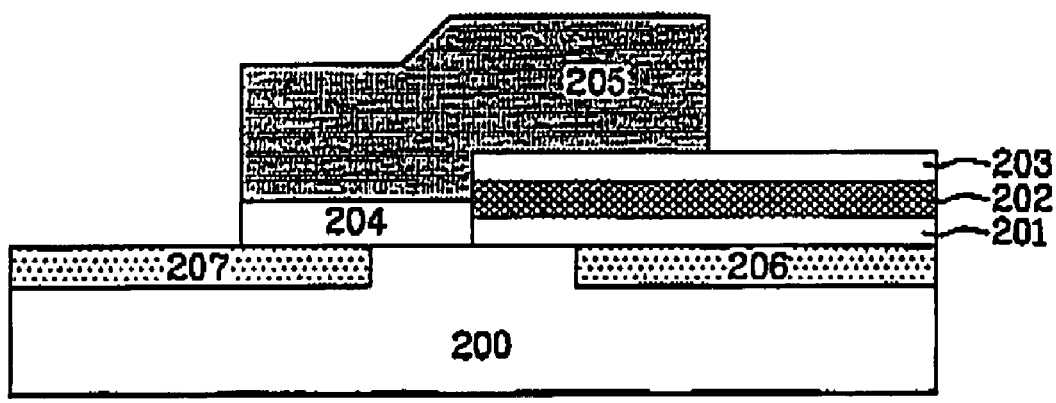

Referring to FIG. 3D, the polysilicon layer is patterned by photolithography and etching to form a gate 205 that remains on the gate oxide layer 204 and extends to cover a portion or the entirety of the patterned ONO structure 201/202/203. If ONO structure 203/202/201 was not completely defined earlier, then the gate etching step may be continued to etch ONO structure 203/202/201 (in one or more subsequent steps, as described above).

And, source 207 and drain 206 are formed in the active area of the substrate 200 by ion implantation aligned with and/or adjacent to sidewalls of gate layer 205. Diffusion annealing generally causes source 205 and drain 206 to partially overlap with or under the gate oxide layer 204 and the patterned ONO structure 203/202/201, respectively.

Finally, contacts and wires (not shown in the drawing) are formed over the substrate 200 to complete a non-volatile memory device according to the present invention. In the present invention, program, read and erase operations are generally the same as for the related art device.

Accordingly, in the mono-gate memory device and fabricating method according to the present invention, the mono split-gate structure is configured using a SONOS cell to prevent cell array malfunctions caused by the over-erased cell.

Conventional split gate memory devices generally contain at least two gates (e.g., containing a floating gate, oxide layer and control gate). However, the present invention implements a split gate structure using a single gate (mono gate), thereby enabling cell size reduction and a relatively even topography across memory devices and logic devices. Moreover, the ONO structure is formed prior to the logic circuit process, whereby memory devices that do not affect logic circuit characteristics can be fabricated.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A mono gate memory device, comprising:
 a substrate having an active area;
 an oxide-nitride-oxide (ONO) layer on the active area of the substrate, the ONO layer comprising a tunnel oxide layer, a trap nitride layer, and a block oxide layer on the active area of the substrate in succession;
 a gate oxide layer on the active area of the substrate, adjacent to the ONO layer;
 a gate on the gate oxide layer and on at least a portion of the ONO layer;
 a drain in the active area adjacent to and partially under the ONO layer; and
 a source in the active area adjacent to and partially under the gate oxide layer.

2. A method of fabricating a mono gate memory device, comprising the steps of:
 forming an oxide-nitride-oxide (ONO) layer on an active area of a substrate;
 forming a gate oxide layer on the active area of the substrate not covered with the ONO layer;
 forming a gate on the gate oxide layer and on the surface of at least a portion of the ONO layer; and
 forming a drain and a source in the active area partially overlapped with the ONO layer and the gate oxide layer, respectively.

3. The method of claim 2, the ONO layer forming step comprising the steps of:
 successively depositing a tunnel oxide layer, a trap nitride layer, and a block oxide layer on the active area of the substrate; and
 patterning the tunnel oxide layer, the trap nitride layer, and the block oxide layer.

4. The method of claim 2, the gate forming step comprising the steps of:
 forming a conductive layer over the substrate; and
 patterning the conductive layer to remain on at least a portion of the ONO layer and the gate oxide layer.

5. The method of claim 4, wherein the conductive layer comprises a polysilicon layer.

6. The mono gate memory device of claim 1, wherein the tunnel oxide layer has a thickness of from 15 to 25 Å.

7. The mono gate memory device or claim 1, wherein the trap nitride layer has a thickness of from 45 to 125 Å.

8. The mono gate memory device of claim 1, wherein the block oxide layer has a thickness of from 20 to 50 Å.

9. The mono gate memory device of claim 1, wherein the gate oxide layer has a thickness of from 45 to 125 Å.

10. The mono gate memory device of claim 1, wherein the gate is on the gate oxide layer and an entire width of the ONO layer.

11. The mono gate memory device or claim 1, wherein the gate comprises polysilicon.

12. The method of claim 2, wherein forming the ONO layer comprises etching the ONO layer following the gate forming step.

13. The method of claim 2, wherein forming the drain and the source comprises implanting ions into regions of the substrate aligned with the gate.

14. The method of claim 2, further comprising forming a logic circuit after forming the ONO layer.

15. An electrically erasable programmable read only memory (EEPROM) having a plurality of memory cells, each of the memory cells comprising:
 an oxide-nitride-oxide (ONO) layer on an active area of a substrate, the ONO layer comprising a tunnel oxide layer, a trap nitride layer, and a block oxide layer;
 a gate oxide layer on the active area of the substrate, adjacent to the ONO layer;
 a gate on the gate oxide layer and on at least a portion of the ONO layer;
 a drain in the active area adjacent to and partially under the ONO layer; and
 a source in the active area adjacent to and partially under the gate oxide layer.

16. The EEPROM of claim 15, wherein the tunnel oxide layer has a thickness of from 15 to 25 Å.

17. The EEPROM of claim 15, wherein the trap nitride layer has a thickness of from 45 to 125 Å.

18. The EEPROM of claim 15, wherein the block oxide layer has a thickness of from 20 to 50 Å.

19. The EEPROM of claim 15, wherein the gate oxide layer has a thickness of from 45 to 125 Å.

20. The EEPROM of claim 15, further comprising a logic circuit.

* * * * *